United States Patent

Arimatsu et al.

[11] Patent Number: 5,317,080
[45] Date of Patent: May 31, 1994

[54] POLYETHER ACRYLAMIDE AND ACTIVE ENERGY RAY CURABLE RESIN COMPOSITION

[75] Inventors: Seiji Arimatsu, Hirakata; Chitoshi Kawaguchi, Souraku; Kazunori Kanda, Yao; Yasuhiro Kimura, Kawasaki; Masao Honma, Kawasaki; Syoichi Asada, Kawasaki; Atsushi Mashita, Kawasaki; Koji Takeuchi, Kawasaki, all of Japan

[73] Assignees: Ajinomto Co., Inc., Tokyo; Nippon Paint Co., Ltd., Osaka, both of Japan

[21] Appl. No.: 980,093

[22] Filed: Nov. 23, 1992

Related U.S. Application Data

[63] Continuation of Ser. No. 543,533, Jun. 26, 1990, abandoned.

[30] Foreign Application Priority Data

Jun. 28, 1989 [JP] Japan .................. 1-166405
Jan. 16, 1990 [JP] Japan .................. 2-6698

[51] Int. Cl.$^5$ ............... C08G 69/26; G03C 1/73; C07C 233/00; C07C 235/00
[52] U.S. Cl. .................. 528/332; 522/175; 430/283; 430/286; 430/288; 564/123; 564/152; 564/153
[58] Field of Search ........... 564/123, 152, 153; 522/174, 175, 176; 430/288, 283, 286; 528/332

[56] References Cited

U.S. PATENT DOCUMENTS

| | | | |
|---|---|---|---|
| 3,776,810 | 12/1973 | Kelley | 161/170 |
| 4,006,024 | 2/1977 | Ibata et al. | 96/115 R |
| 4,134,916 | 1/1979 | Moss et al. | 260/561 N |
| 4,393,237 | 7/1983 | Yeakey et al. | 564/153 |
| 4,536,600 | 8/1985 | Yeakey et al. | 564/153 |
| 4,914,223 | 4/1990 | Rasmussen et al. | 564/159 |

FOREIGN PATENT DOCUMENTS

| | | |
|---|---|---|
| 0177289 | 4/1986 | European Pat. Off. |
| 0249306 | 12/1987 | European Pat. Off. |
| 0299591 | 1/1989 | European Pat. Off. |
| 2100487 | 3/1972 | France |

*Primary Examiner*—Susan Berman
*Attorney, Agent, or Firm*—Oblon, Spivak, McClelland, Maier & Neustadt

[57] ABSTRACT

Disclosed herein is a polyether acrylamide derivative of the following general formula (I):

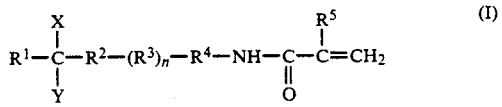

as well as an active energy ray curable resin composition comprising at least one polyether acrylamide derivative of the above general formula (I) and a cured product produced by curing such an active energy curable resin composition with active energy rays.

2 Claims, 9 Drawing Sheets

POLYETHER ACRYLAMIDE AND ACTIVE ENERGY RAY CURABLE RESIN COMPOSITION

This application is a continuation of application Ser. No. 07/543,533, filed on Jun. 26, 1990, now abandoned.

BACKGROUND OF THE INVENTION

The present invention relates to novel polyether acrylamide derivatives useful as a component for active energy ray curable resin compositions used in printing plates, paints, printing inks, adhesives, photoresists, and the like.

Heretofore, photo-sensitive resin compositions of radical polymerization type consisting mainly of mono- or polyfunctional (meth)acrylates have been used in the fields of printing plates and photoresists because of their capability of forming fine line pattern images. In addition, such resin compositions have been increasingly applied to paints, printing inks, adhesives, etc., making use of their characteristic that they are usable without solvents. Polyether acrylates and polyurethane acrylates have been developed to impart flexibility and toughness to cured products. However, when prior (meth)acrylates are used, there can be obtained resin compositions which cure only slowly. In particular, the surface of resin compositions contacted with air or a thick film is extremely inferior in curability.

Though acrylamide compounds generally have a superior solubility in water because of their high cohesive energy, the compatibility of acrylamide compounds with non-aqueous solvent or resins was not sufficient. Therefore, acrylamide compound became incompatible or separation problems often took place when they were mixed with non-aqueous solvent or resins. Moreover, generation of formalin from starting materials which were used to prepare some ordinary acrylamide derivatives of polyether type, became a big issue from the point of safety and sanitation for human beings. It has therefore been strongly desired to develop acrylamide compounds which are excellent in their curability and, at the same time, are capable of imparting both flexibility and toughness to cured resin products, and are safe and sanitary for human beings.

It is therefore an object of the present invention to provide novel polyether acrylamide compounds which are not only excellent in curability and compatibility with solvent or resins, but are capable of imparting flexibility and toughness to cured resin products, and are safe and sanitary for human beings.

It is another object of the present invention to provide active energy ray curable resin composition comprising such acrylamide compounds.

SUMMARY OF THE INVENTION

In one aspect of the invention, there is provided a polyether acrylamide derivative of the following general formula (I):

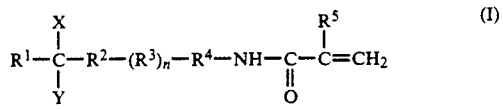

In another aspect of the invention, there is provided an active energy curable resin composition comprising at least one polyether acrylamide derivative of the above general formula (I).

In a third aspect of the invention, there is provided a cured product produced by hardening such an active energy curable resin composition with active energy rays.

DETAILED DESCRIPTION OF THE INVENTION

Figure 1:
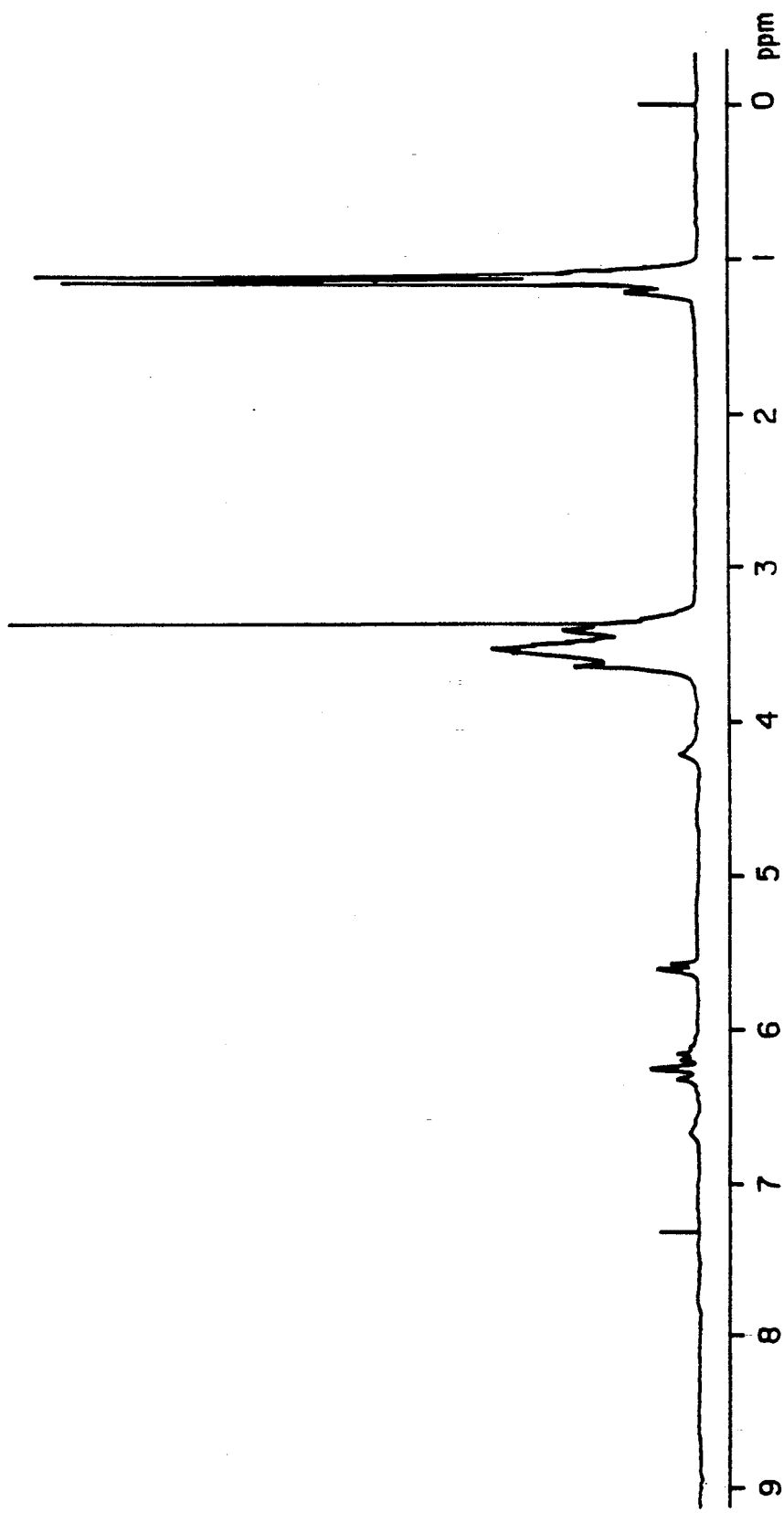
FIGS. 1 to 9 show the NMR spectra of polyether acrylamide derivatives synthesized in Examples 1 to 8 and in Example 11.
Figure 2:
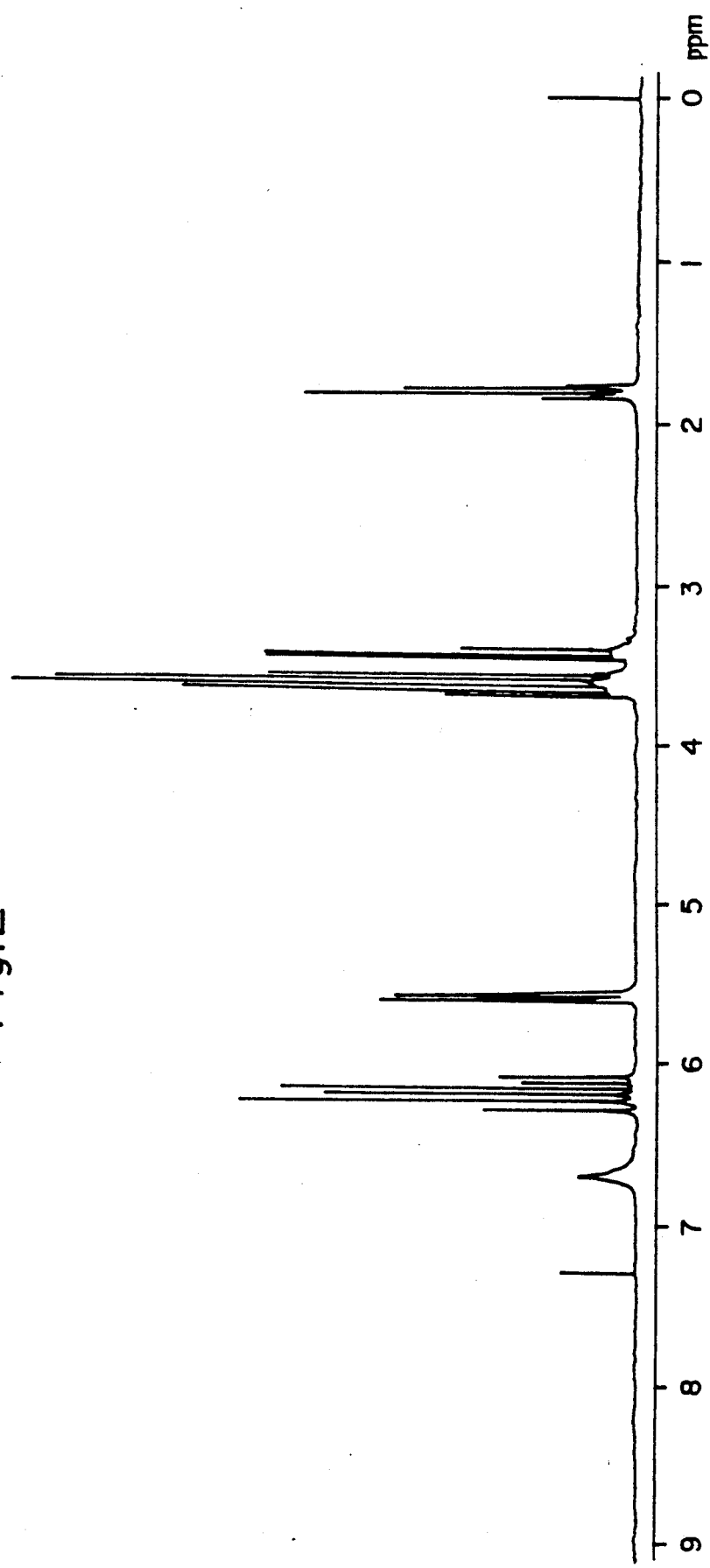
Figure 3:
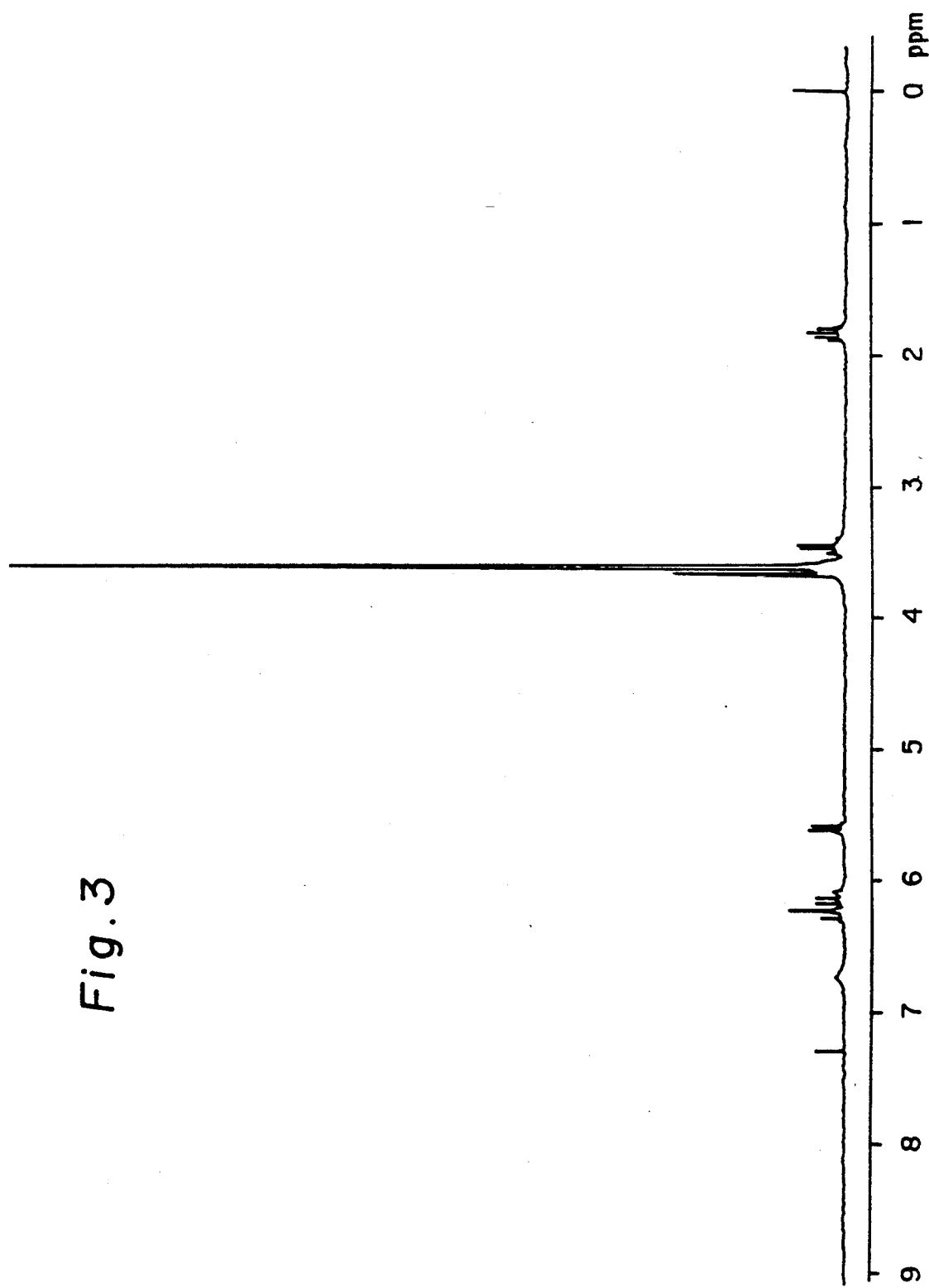
Figure 4:
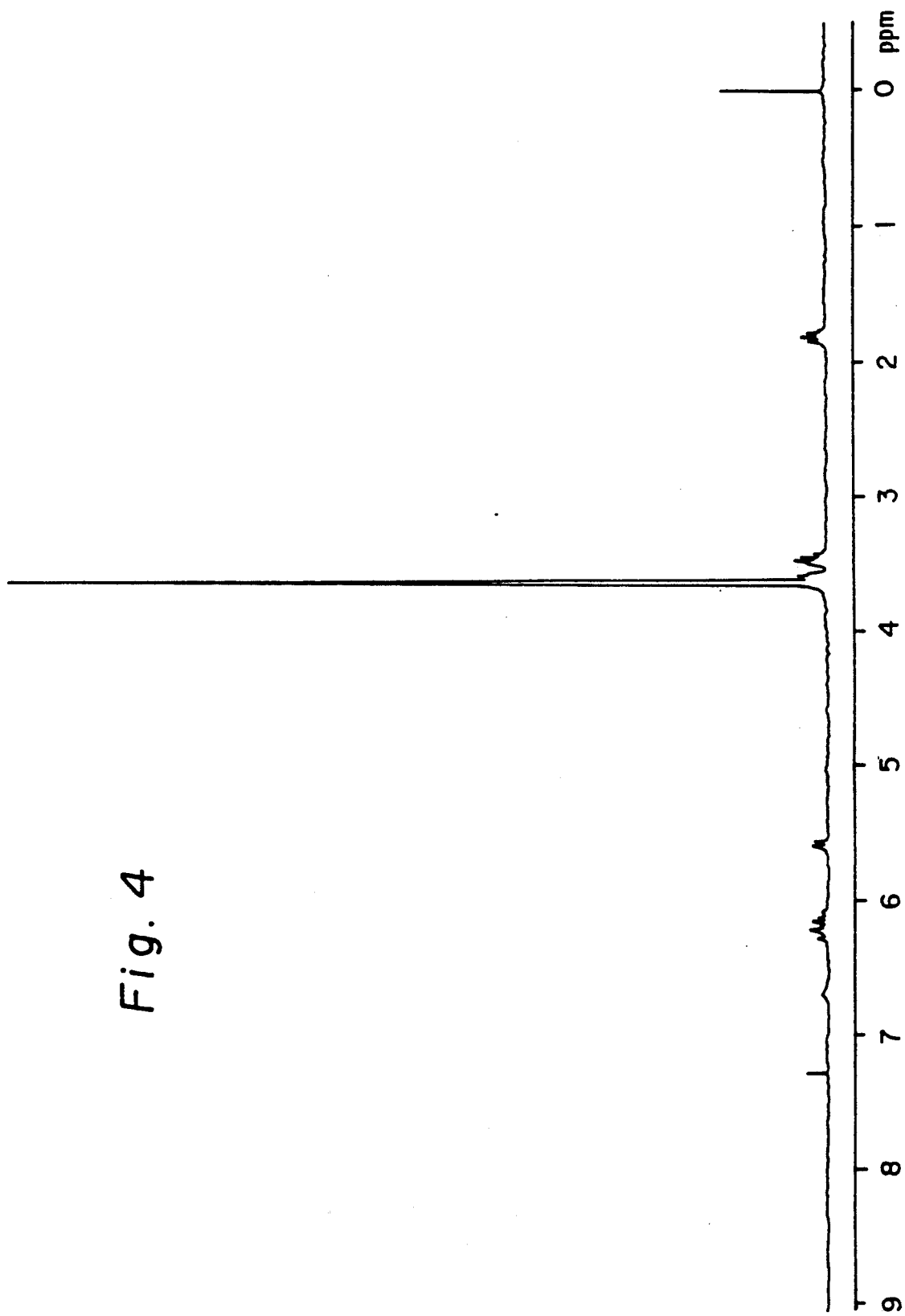
Figure 5:
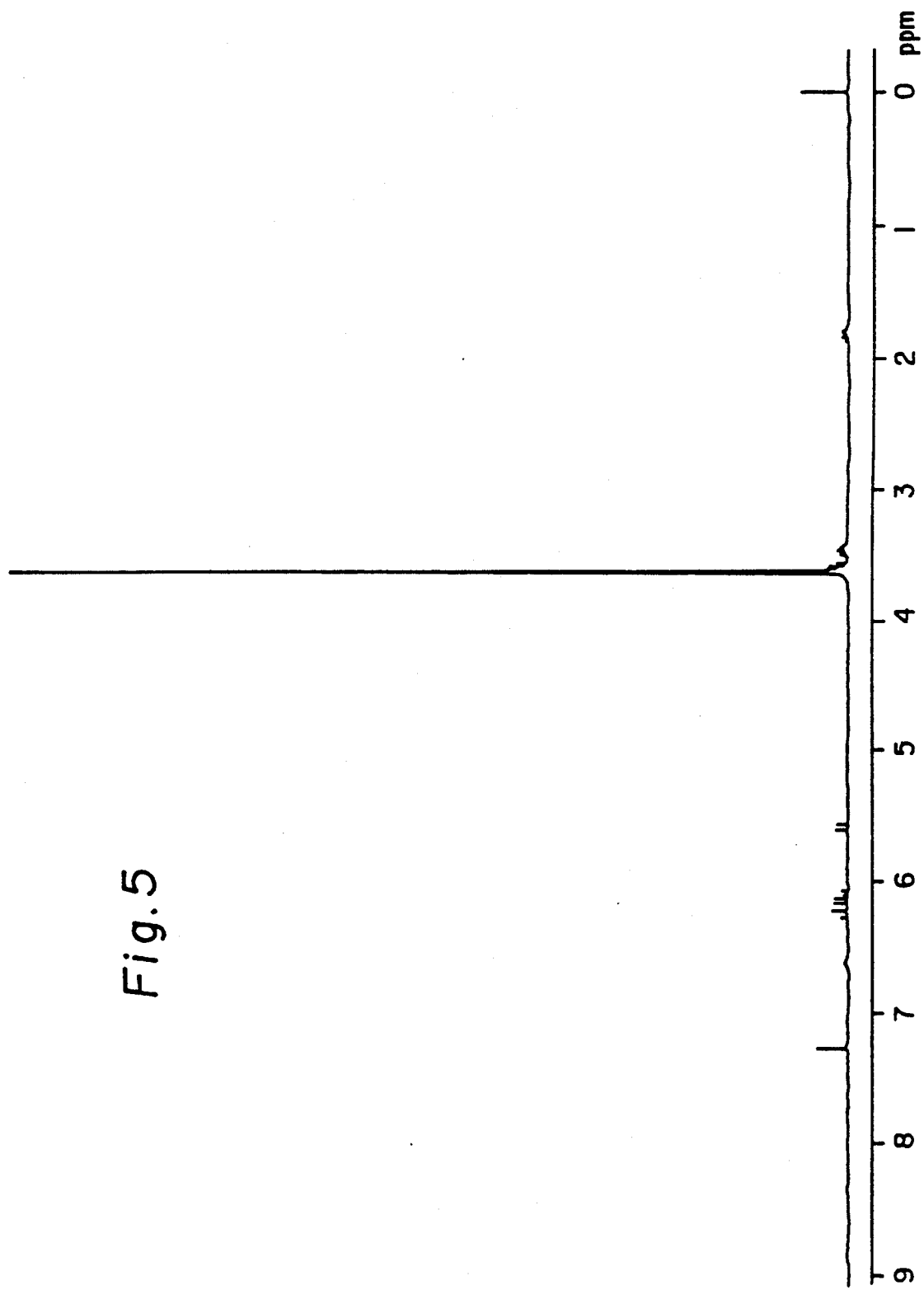
Figure 6:
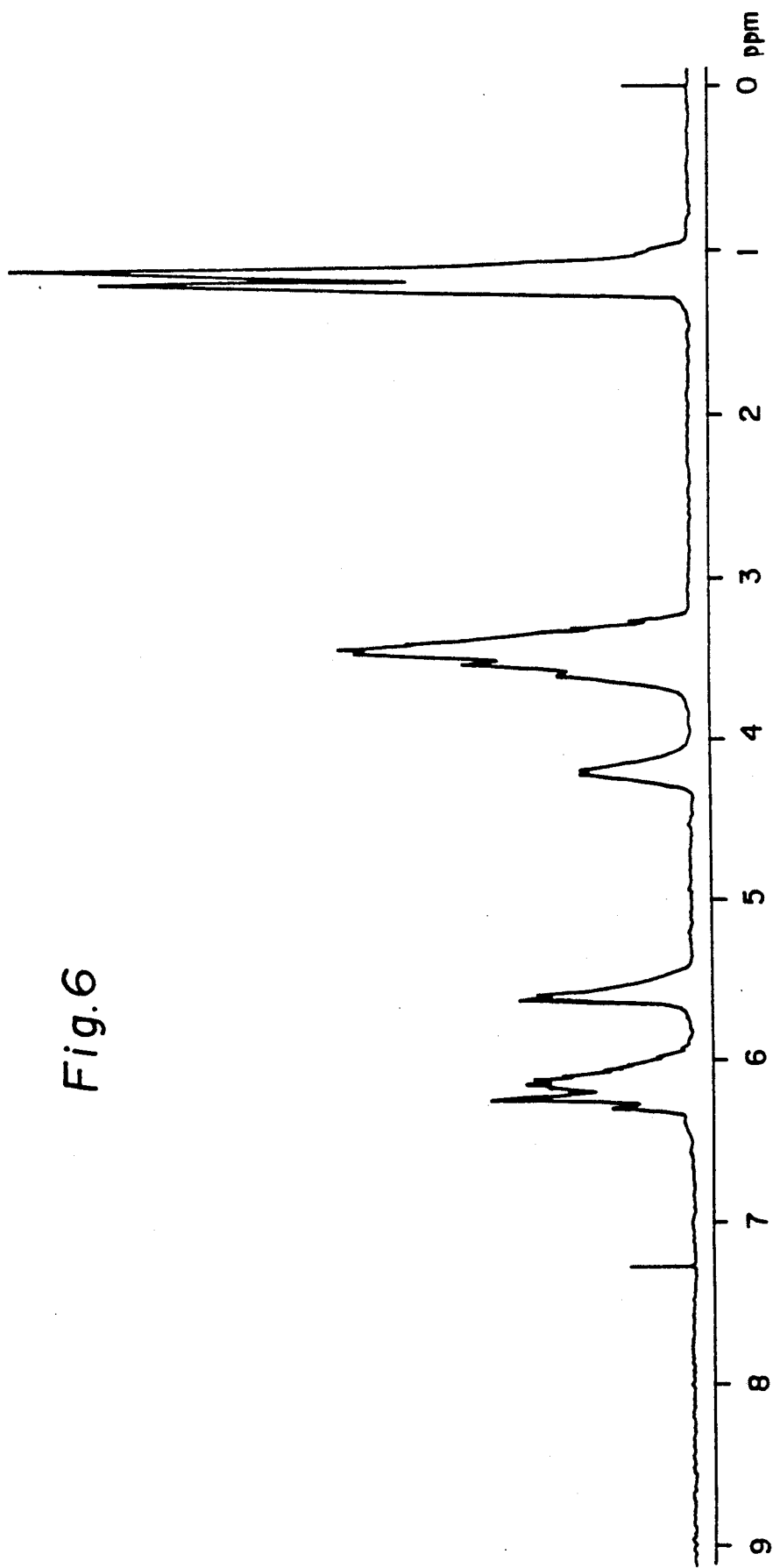
Figure 7:
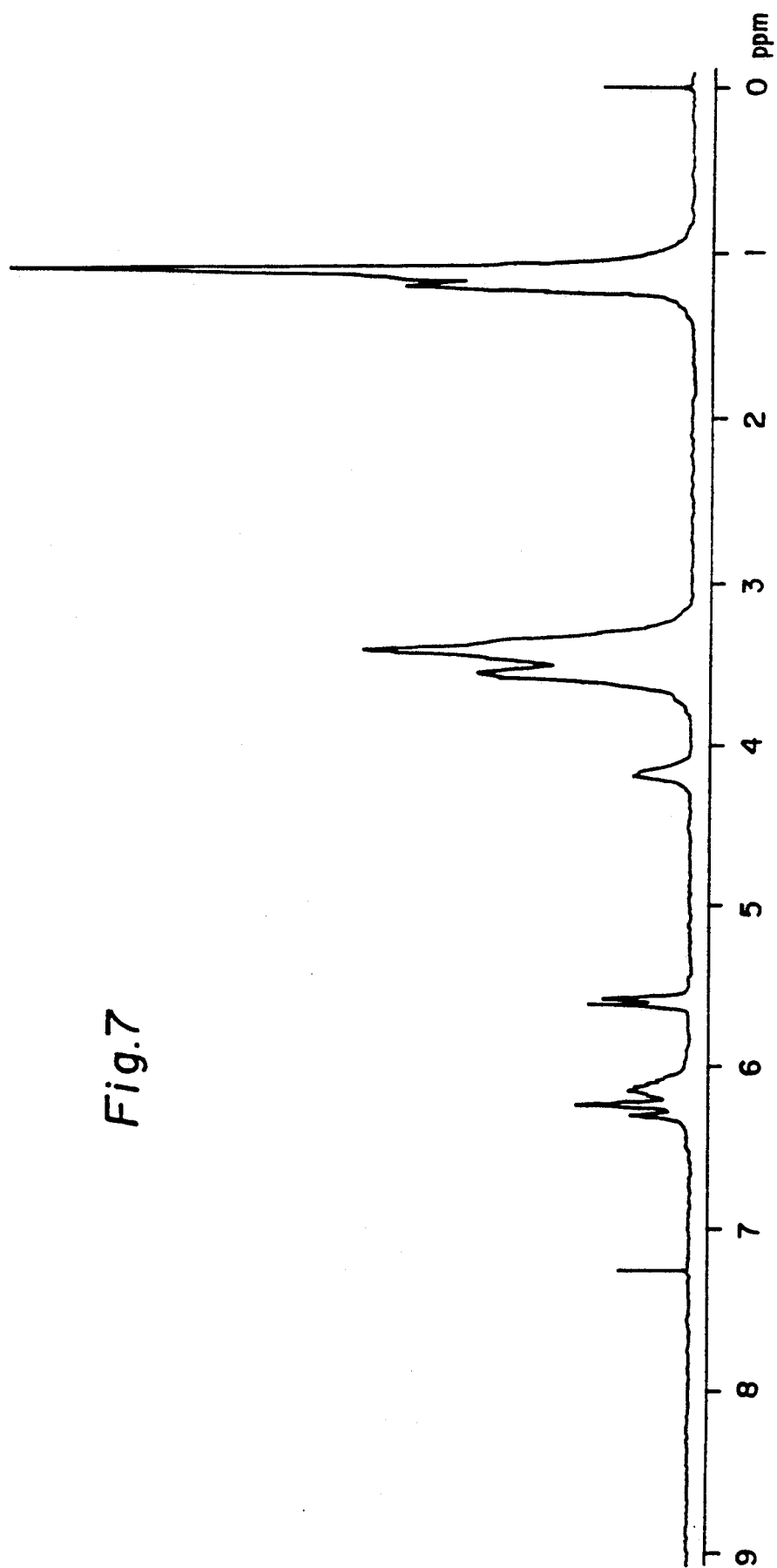
Figure 8:
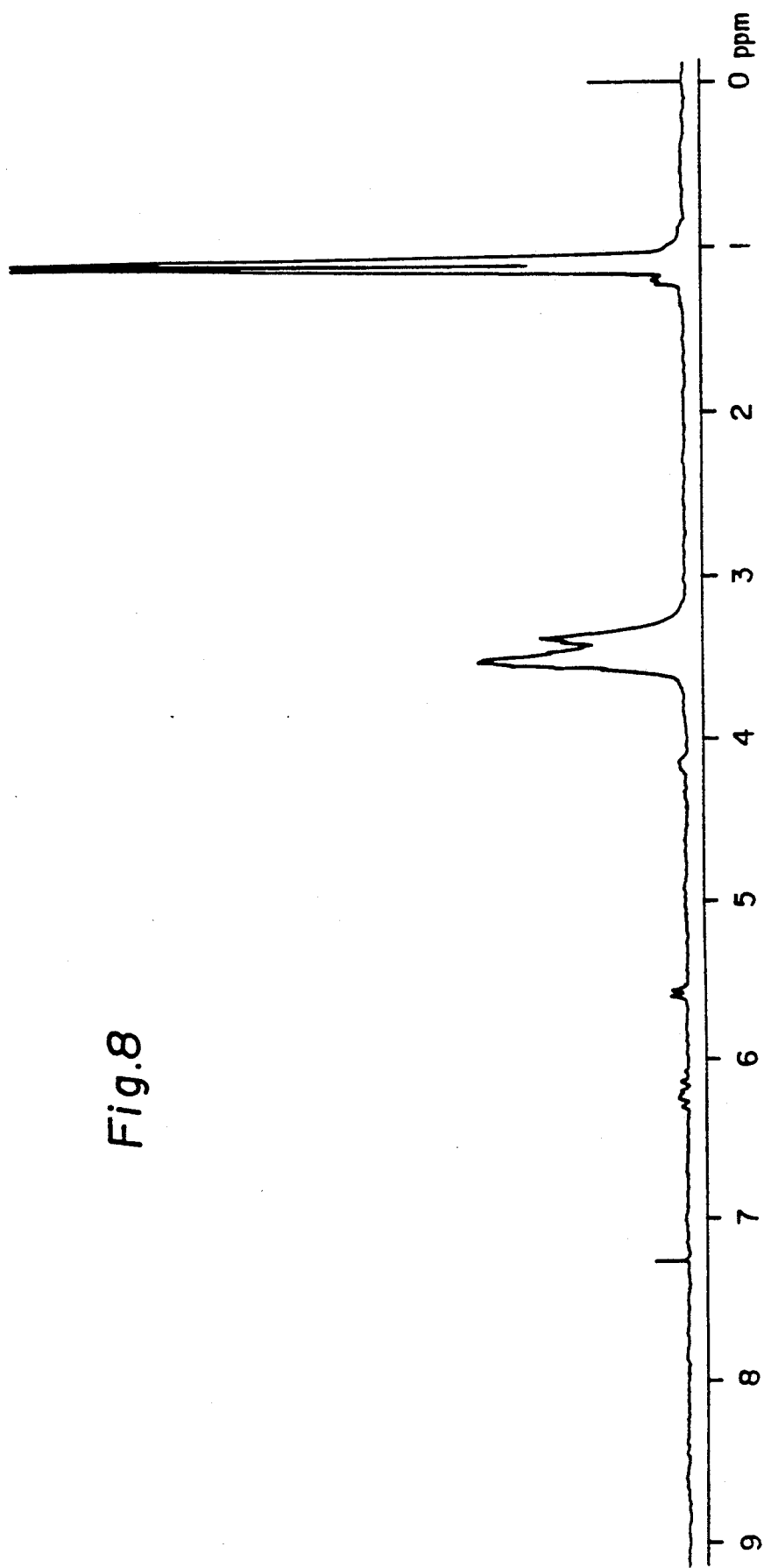
Figure 9:
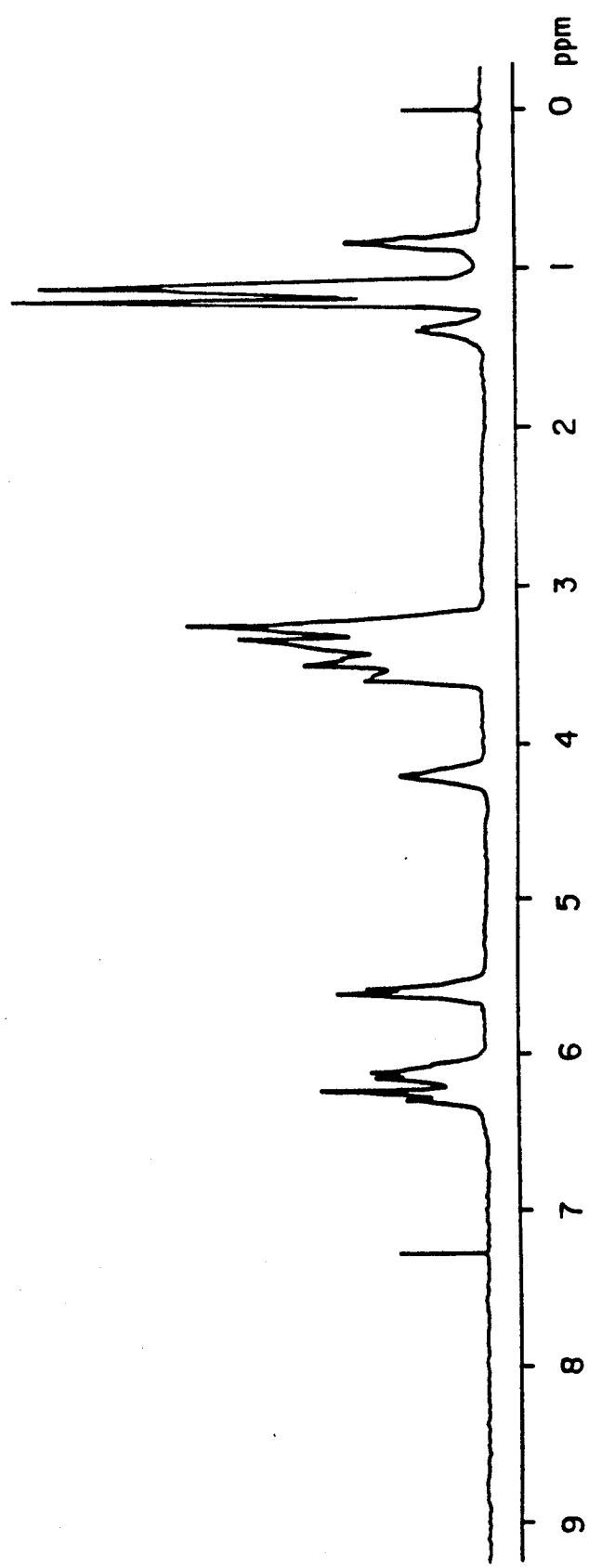

The present inventors have conducted intensive studies on novel polyether acrylamide compounds which are not only excellent in curability, but are capable of imparting flexibility and toughness to active energy ray cured resin products. As a result, it has now been found that radical polymerizable polyether (meth)acrylamides derived from polyether amines, which have been known as being capable of imparting excellent toughness and flexibility to cured epoxy resin products, are rapidly curable and can form excellent active energy ray cured resin products.

Accordingly, there is provided by the present invention novel polyether acrylamide derivatives represented by the following general formula (I):

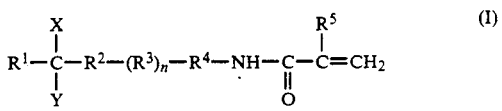

wherein $R^1$ represents —H, —OH or an alkyl group having 1 to 10 carbon atoms; $R^2$ represents a single bond, —CH$_2$—, —CH$_2$CH$_2$CH$_2$— or —CH(CH$_3$)—; $(R^3)_n$ represents consisting of —OCH$_2$CH$_2$—, —OCH$_2$CH(CH$_3$)—, —OCH(CH$_3$)CH$_2$— or —OCH$_2$CH$_2$CH$_2$CH$_2$— or a copolymer consisting of at least two of said four kinds of recurring units, n being an integer of 1 to 150; $R^4$ represents a single bond or —OCH$_2$CH$_2$CH$_2$—; $R^5$ represents —H or —CH$_3$; and X and Y each independently represents —H, an alkyl group having 1 to 10 carbon atoms or a group represented by the following general formula (II):

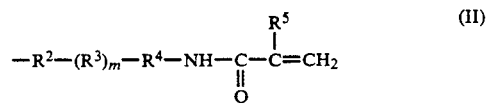

in which $R^2$ represents a single bond, —CH$_2$—, —CH$_2$CH$_2$CH$_2$— or —CH(CH$_3$)—; $(R^3)m$ represents a homopolymer consisting of —OCH$_2$CH$_2$—, —OCH$_2$CH(CH$_3$)—, —OCH(CH$_3$)CH$_2$— or —OCH$_2$CH$_2$CH$_2$CH$_2$— or a copolymer consisting of at least two of said four kinds of recurring units, m being an integer of 0 to 150; $R^4$ represents a single bond or —OCH$_2$CH$_2$CH$_2$—; and $R^5$ represents —H or —CH$_3$.

There are also provided by the present invention active energy ray curable resin compositions comprising at least one of those polyether acrylamide derivatives, as well as cured products prepared by curing such active energy ray curable composition by means of active energy rays.

The polyether acrylamide derivatives according to the present invention can be obtained by various known methods. In one method, for example, a polyether amine is dissolved in an organic solvent, such as methylene chloride, toluene or diethyl ether, and a required quantity of (meth)acrylic chloride is gradually added dropwise thereto at a temperature not higher than room temperature in the presence of an excess of a caustic alkali to give a polyether acrylamide derivative.

Examples of polyetheramines usable in the present invention include:

(1) Monoamines, such as polyethylene glycol monoalkylmonoaminopropyl ethers, polypropylene glycol monoalkylmonoaminopropyl ethers, polytetramethylene ether glycol monoalkylmonoaminopropyl ether, polyethylene glycol monoalkyl ether monoamines, polypropylene glycol monoalkyl ether monoamines, polytetramethylene ether glycol monoalkyl ether monoamines, and copolymers thereof;

(2) Diamines, such as polyethylene glycol bisaminopropyl ethers, polypropylene glycol bisaminopropyl ethers, polytetramethylene ether glycol bisaminopropyl ethers, polyethylene glycol diamines, polypropylene glycol diamines, polytetramethylene ether glycol diamines, Pluronic type polyether bisaminopropyl ethers, and copolymers thereof; and (3) Triamines, such as trimethylolpropane tris(polyethylene glycol monoaminopropyl ether) ethers, trimethylolpropane tris(polypropylene glycol monoaminopropyl ether) ethers, glycerol tris(polyethylene glycol monoaminopropyl ether) ethers, glycerol tris(polypropylene glycol monoaminopropyl ether) ethers, trimethylolpropane tris(polyethylene glycol monoamine) ethers, trimethylolpropane tris(polypropylene glycol monoamine) ethers, glycerol tris(polyethylene glycol monoamine) ethers, glycerol tris(polypropylene glycol monoamine) ethers, and copolymers thereof.

The polyether (meth)acrylamides according to the present invention can be incorporated into compositions comprising the other photopolymerizable monomers, polymeric binders, photopolymerization initiators and sensitizers, or into compositions comprising part of these ingredients, to form resin compositions which can be used for printing plates, paints, printing inks, adhesives, photoresists, and the like.

The other photopolymerizable monomers according to the present invention include any radical polymerizable ethylenically unsaturated monomers which are, for example, an unsaturated carboxylic ester, such as methyl (meth)acrylate, ethyl (meth)acrylate, n-propyl (meth)acrylate, 2-hydroxyethyl (meth)acrylate, 2-hydroxypropyl (meth)acrylate, polyethyleneglycol mono(meth)acrylate, polypropyleneglycol mono(meth)acrylate, polyethyleneglycol di(meth)acrylate, polypropyleneglycol di(meth)acrylate, methoxypolyethyleneglycol mono(meth)acrylate, ethoxypolyethyleneglycol mono(meth)acrylate, glycerol di(meth)acrylate, pentaerythritol di(meth)acrylate, trimethylolpropane tri(meth)acrylate, pentaerythritol tetra(meth)acrylate, ethyleneglycol diglycidylether di(meth)acrylate, polyethyleneglycol diglycidylether di(meth)acrylate, 1,4-butanediol di(meth)acrylate, 1,6-hexanediol di(meth)acrylate; an unsaturated amide, such as (meth)acrylamide, N-methylol(meth)acrylamide, n-buthoxymethyl(meth)acrylamide, isobuthoxymethyl(meth)acrylamide, N-t-butyl(meth)acrylamide, methylenebis(meth)acrylamide, ethylenebis(meth)acrylamide, propylenebis(meth)acrylamide. In the above and somewhere else, for example, "(meth)acrylate" refers to acrylate and methacrylate collectively or separately.

The polymeric binder incorporated to the photosensitive resin composition according to the present invention is used for controlling the viscosity of the resin composition and physical property or chemical resistance of cured product. A polymeric binder with a polymerization degree of from 10 to 5,000, or a polymeric binder with a molecular weight of from 1,000 to 1,000,000 is preferred. The polymeric binder itself may include radical polymerizable ethylenically unsaturated groups in the molecule.

When the resin composition is used as a printing material, it intends for the improvement of durability, ink-resistance and chemical-resistance of a relief. Specifically, the polymeric binder includes water soluble polymers such as polyvinyl alcohol, partially saponified polyvinyl acetate, modified partially saponified polyvinyl acetate, cellulose polymer, polyacrylamide polymer and polyvinyl pyrrolidone, and organic solvent-soluble polymer such as butadiene, isoprene, chloroprene, 1,3-pentadiene, styrene, vinyl acetate, ethylene, (meth)acrylic ester and acrylonitrile in the form of homopolymer, copolymer or block copolymer of them. For the flexographic printing material, there are preferably used polymers having rubber-like elasticity such as 1,2-polybutadiene, 1,4-polybutadiene, or styrene-butadiene, styrene-butadiene-styrene, styrene-isoprene-styrene or styrene-isoprene-$C_4$-$C_5$ aliphatic diene hydrocarbons in the form of copolymer, or modified polymers thereof. Further, as an alkali-soluble polymer, there can be mentioned, for example, copolymers comprising the monomers as described above and (meth)acrylic acid as the co-monomer ingredient.

In addition, modified acrylate oligomer or polymer such as unsaturated polyester, epoxy acrylate, polyurethane acrylate, polyester acrylate, polyether acrylate and silicone acrylate.

And in the use for paint, printing inks, adhesives or photoresist, acrylic resin, polyester resin, alkyd resin, epoxy resin, polyvinyl resin, fluoro resin, silicone resin, polyphenol resin, amino resin, polybutadiene resin and polyurethane resin or modified resins thereof are used as a polymeric binder independently or as the mixture of two or more resins in an arbitrary ratio.

Moreover, (meth)acrylate resins having ethylenically unsaturated groups which were obtained by modification of these resins and resins modified with (meth)acryl monomer or combination of diisocyanate and (meth)acryl monomer can be used as a polymeric binder.

The photopolymerization initiator according to the present invention may be anyone that is known to the art. Typical examples of the initiators are benzoin ethers (such as benzoin methyl ether, benzoin isopropyl ether, benzoin isobutyl ether), benzophenones (such as benzophenone, methyl o-benzoylbenzoate, N,N'-tetraethyl-4,4'-diaminobenzophenone, Michler's ketone), acetophenones (such as 2,2-diethoxyacetophenone, 2,2-dimethoxy-2-phenylacetophenone, 1-hydroxycyclohexyl phenyl ketone, 2-hydroxy-2-methyl-1-phenylpropan-1-one), and camphor quinone.

Co-initiators which can be incorporated into photosensitive resin composition may be aliphatic amines, especially tertiary amines, and sulfur-containing compounds. Examples of such co-initiators include triethanolamine, N-methyldiethanolamine, N-butyldiethanolamine, ethyl 4-dimethylbenzoate, triethylamine, dimethylethanolamine, 2-(n-butoxy)ethyl 4-dimethylaminobenzoate, 2-(dimethylamino)ethyl benzoate and 4-benzoyl-4'-methyl diphenyl sulfide.

The resin composition according to the present invention may further contain additives, if necessary, such as a solvent (for example, water, alcohols, etc.), a plasticizer, a polymerization inhibitor, an anti-oxidant, a dye, an inorganic filler, and an organic filler.

The desirable amount of each component in the active energy ray curable resin composition according to the present invention is as follows; based on 100 parts by weight of polymeric binders, 1 to 200 parts by weight of polyether acrylamide derivatives and 1 to 80 parts by weight of other polymerizable ethylenically unsaturated monomers. Especially, in the photo-sensitive resin composition, based on 100 parts by weight of polymeric binders, 1 to 200 parts by weight, preferably 10 to 150 parts by weight, of polyether acrylamide derivatives, 1 to 80 parts by weight, preferably 3 to 30 parts by weight, of other polymerizable ethylenically unsaturated monomers and 0.2 to 10 parts by weight, preferably 0.5 to 5 parts by weight of photopolymerization initiators.

When the photosensitive resin composition according to the present invention is applied to a water developable relief printing material, the following composition is particularly useful. That is, a composition comprising a polymer binder of a partially saponified polyvinyl acetate or a modified partially saponified polyvinyl acetate co-polymerized with acids having an ethylenically unsaturated group and a carboxyl group or sulfonic group such as (meth)acrylic acid, itaconic acid, maleic acid anhydride, 2-acrylamidepropanesulfonic acid, (meth)acrylsulfonic acid, having a saponiication degree of from 30 to 95 mol %, preferably, from 50 to 90 mol % and a polymerization degree of from 100 to 5000, preferably, from 200 to 1000 and a polyether acrylamide derivative of the general formula (I) in which each of $(R^3)_n$ and $(R^3)m$ represents a homopolymer of $-O-CH_2CH_2-$, $n=1-50$, preferably, $1-15$ and $m=0-50$, preferably, $0-15$, the composition ratio of the polymer binder and the polyether acrylamide derivative being from 5 to 200 parts by weight, preferably, from 20 to 150 parts by weight of the polyether acrylamide derivative based on 100 parts by weight of the binder.

If the saponification degree is lower than the value as described above, water-developability can not be obtained and no satisfactory printing material can be obtained because of the tackiness of the mixture. On the other hand, if the saponification degree is greater than the above-mentioned value, no satisfactory relief image can be obtained, since the compatibility with the monomer is poor.

If the polymerization degree is lower than the value described above, the strength of the printing material prepared is low and, on the other hand, if it is higher than the value, the viscosity of the resin is excessively high failing to prepare the printing material.

Further, if $R^3$ is other than $-OCH_2CH_2-$, no water developability can be obtained and toughness after curing is neither preferred since the compatibility with the binder is poor.

Further, if the value for each of n, m is greater than the above-mentioned value, a tough relief can not be obtained since the compatibility with the binder is poor.

When the composition is used as the flexographic printing material, there is used a composition comprising 100 parts by weight of at least one of polymer binders selected from 1,4-polybutadiene, 1,2-polybutadiene, styrene-isoprene-styrene block copolymer, styrene-butadiene block copolymer and styrene-butadiene-styrene block copolymer providing a printing material with a Shore A hardness of from 25 to 70, preferably, 30 to 60 and, based thereon, from 2 to 100 parts by weight and preferably 5 to 60 parts by weight of a polyether acrylamide derivative represented by the general formula (I) and comprising a homopolymer in which each of $(R^3)_n$ and $(R^3)m$ represents $OCH_2CH(CH_3)$, $OCH(CH_3)CH_2$ or $OCH_2CH_2CH_2CH_2$, or a copolymer comprising at least two of the above-mentioned three components, in which n is a polymerization degree of from 1 to 150, preferably, 1 to 50 and m is a polymerization degree of from 0 to 150 and, preferably, 0 to 50, 1 to 80 parts by weight of other photopolymerizable monomer, and 0.2 to 10 parts by weight of a photopolymerization initiator. If the ratio of the polyether acrylamide derivative is lower, no tough relief can not be obtained. On the other hand, if the polyether acrylamide derivative is excessive, there is a problem that the compatibility with the polymer binder is reduced, the developability is lowered or the image quality is deteriorated.

Further, if the Shore hardness of the printing material is higher, no satisfactory printing quality can be obtained upon flexographic printing. If it is lower, the storage stability of the printing material is deteriorated or the dot gain is large failing to obtain a satisfactory image quality, If the repeating number for $(R^3)_n$ and $(R^3)m$ of the polyether acrylamide derivative is greater, there are problems such as lowering of the developability and the reduction of toughness of the printing material. Further, if the repeating unit is $-OCH_2CH_2-$, there is a problem of poor compatibility, deteriorated developability, etc.

Further, when the resin composition is used for paint, printing ink, adhesive or photosensitive resist, the composition comprises 1 to 200 parts by weight of the polyether acrylamide derivative, 1 to 80 parts by weight of other photopolymerizable monomers and 0.2 to 10 parts by weight of the photopolymerization initiator based on 100 parts by weight of the polymer binder. The composition may be colored or improved with physical property or chemical resistance of the film by mixing from 0 to 40 parts by weight, preferably, from 0 to 15 parts by weight of an organic or inorganic pigment or filler based on 100 parts by weight of the resin composition.

In the composition, the polyether acrylamide derivative is used, preferably, by from 5 to 80 parts by weight based on 100 parts by weight of the polymer binder. If the amount is smaller, tough cured film can not be obtained. On the other hand, if it is excessive, there is a problem that the property of the polymer binder can not be utilized, the water resistance or solvent resistance of the cured film is deteriorated.

In addition, if the amount of other photopolymerizable monomer or photopolymerization initiator is larger, no satisfactory balance can be obtained for the physical properties of the cured film and, if it is smaller, the curing property is deteriorated.

The photo-sensitive resin composition according to the present invention may be prepared by art-known methods, e.g. mixing in a kneader the above-mentioned components, or dissolving them with suitable solvents. The resin composition thus obtained, if it is used for printing plate, may be coated on a suitable substrate (for example, aluminum plate, polyester sheet, copper plate, zinc plate, chromium-plated steel plate, glass plate, steel plate, etc.) by means of art-known coating methods, followed by drying for volatile ingredients to be eliminated, or may be extruded to form the photosensitive resin plate. The thickness of the photosensitive layer is not particularly limited, but it is, for example, 0.1 to 10 mm.

The photosensitive resin plate thus obtained is exposed to light, such as ultraviolet light, through a negative film having a suitable image to cure portions which are exposed to light. Light source is not limited, if it can emit the light which can initiate radical polymerization. Typical example is chemical lamp, medium or high pressure Hg lamp, metal halide lamp, and so on. Then, the resin plate is developed by means of art-known methods to generate the image; that is, after the negative film is removed, unexposed portion is eliminated by spraying or brushing with a suitable solvent (for example, water, or alkaline aqueous solution, alcohols, halogenated hydrocarbons such as trichloroethane, trichloroethylene, tetrachloroethylene, etc., aromatic hydrocarbons such as toluene, xylene, etc. and other organic solvents), followed by drying, if necessary, or post-curing to form a durable cured resin layer.

Describing the composition according to the present invention which is used for paint, printing inks, adhesives or photoresist, (after coating the photosensitive composition thus obtained on the substrate such as metal, plastics, paper etc., and eliminating volatile component such as solvent etc., if necessary) film or plastics can be obtained as a final product by irradiating to the active energy ray such as UV, deep UV, electronic ray, X-ray etc. under normal pressure or reduced pressure.

It is preferably used for substrate which is not suitable for elevating temperature or requires much energy for elevating temperature, and it can be used as UV-ray curable paint, electronic ray curable paint, X-ray curable paint.

Examples are mentioned below but these examples do not restrict the utilization range of the present invention.

The present invention will further be illustrated by means of examples.

EXAMPLE 1

Into 200 ml of methylene chloride was dissolved 60 g of JEFFAMINE M-600 (ethylene glycol-propylene glycol copolymer monoalkyl ether monoamine, manufactured by Texaco Chemical Co.), and then 40 g of aqueous 50% caustic soda solution was added thereto. While being ice-cooled, 10 g of acryloyl chloride was added dropwise over a period of 60 minutes, and then the resulting mixture was stirred for 30 minutes at room temperature.

Thereafter, 200 ml of water was added, and the organic layer was separated and washed three times with 200 ml of saturated aqueous sodium chloride solution. Thereafter, the organic layer was dried with magnesium sulfate and subjected to filtration, and the solvent was evaporated off under reduced pressure to give 62 g of colorless oily product. Yield: 95%.

EXAMPLE 2

Into 42 ml of methylene chloride was dissolved 20 g of PEOAMINE 200 (polyethylene glycol #200 bisaminopropyl ether, manufactured by Kawaken Fine Chemical Co.), and then 20 g of aqueous 50% caustic soda solution was added thereto. While being ice-cooled, 19 g of acryloyl chloride was added dropwise over a period of 60 minutes, and then the resulting mixture was stirred for 30 minutes at room temperature.

Thereafter, 50 ml of water was added, and the organic layer was separated and washed three times with 50 ml of saturated aqueous sodium chloride solution. Thereafter, the organic layer was dried with magnesium sulfate and subjected to filtration, and the solvent was evaporated off under reduced pressure to give 20 g of waxy product. Yield: 67%.

EXAMPLE 3

Into 60 ml of methylene chloride was dissolved 48 g of PEOAMINE 400 (polyethylene glycol #400 bisaminopropyl ether, manufactured by Kawaken Fine Chemical Co.), and then 24 g of aqueous 50% caustic soda solution was added thereto. While being ice-cooled, 23 g of acryloyl chloride was added dropwise over a period of 60 minutes, and then the resulting mixture was stirred for 30 minutes at room temperature.

Thereafter, 100 ml of water was added, and the organic layer was separated and washed three times with 100 ml of saturated aqueous sodium chloride solution. Thereafter, the organic layer was dried with magnesium sulfate and subjected to filtration, and the solvent was evaporated off under reduced pressure to give 33 g of oily product. Yield: 54%.

EXAMPLE 4

Into 800 ml of methylene chloride was dissolved 720 g of PEOAMINE 600 (polyethylene glycol #600 bisaminopropyl ether, manufactured by Kawaken Fine Chemical Co.), and then 320 g of aqueous 50% caustic soda solution was added thereto. While being ice-cooled, 235 g of acryloyl chloride was added dropwise over a period of 4 hours, and then the resulting mixture was stirred for 60 minutes at room temperature.

Thereafter, 500 ml of water was added, and the organic layer was separated and washed three times with 500 ml of saturated aqueous sodium chloride solution. Thereafter, the organic layer was dried with magnesium sulfate and subjected to filtration, and then the solvent was evaporated off under reduced pressure to give 773 g of oily product. Yield: 91%.

EXAMPLE 5

Into 200 ml of methylene chloride was dissolved 223 g of PEOAMINE 1000 (polyethylene glycol #1000 bisaminopropyl ether, manufactured by Kawaken Fine Chemical Co.), and then 80 g of aqueous 50% caustic soda solution was added thereto. While being ice-cooled, 40 g of acryloyl chloride was added dropwise over a period of 2 hours and then the resulting mixture was stirred at room temperature for 60 minutes.

Thereafter, 100 ml of water was added, and the organic layer was separated and washed three times with 200 ml of saturated aqueous sodium chloride solution. Thereafter, the organic layer was dried with magnesium sulfate and subjected to filtration, and the solvent was evaporated off under reduced pressure to give 205 g of oily product. Yield: 84%.

EXAMPLE 6

Into 300 ml of methylene chloride was dissolved 147 g of JEFFAMINE D-230 (polypropylene glycol diamine of an average molecular weight of 230, manufactured by Texaco Chemical Co.), and then 125 g of aqueous 50% caustic soda solution was added thereto. While being ice-cooled, 116 g of acryloyl chloride was added dropwise over a period of 2.5 hours, and then the resulting mixture was stirred for 30 minutes at room temperature.

Thereafter, 200 ml of water was added, and the organic layer was separated and washed three times with 200 ml of saturated aqueous sodium chloride solution. Thereafter, the organic layer was dried with magnesium sulfate and subjected to filtration, and the solvent was evaporated off under reduced pressure to give 164 g of oily product. Yield: 82%.

EXAMPLE 7

Into 400 ml of methylene chloride was dissolved 200 g of JEFFAMINE D-400 (polypropylene glycol diamine of an average molecular weight of 400, manufactured by Texaco Chemical Co.), and then 110 g of aqueous 50% caustic soda solution was added thereto. While being ice-cooled, 95 g of acryloyl chloride was added dropwise over a period of 2.5 hours, and then the resulting mixture was stirred for minutes at room temperature.

Thereafter, 300 ml of water was added, and the organic layer was separated and washed three times with 300 ml of saturated aqueous sodium chloride solution. Thereafter, the organic layer was dried with magnesium sulfate and subjected to filtration, and the solvent was evaporated off under reduced pressure to give 171 g of oily product. Yield: 67%.

EXAMPLE 8

Into 400 ml of methylene chloride was dissolved 200 g of JEFFAMINE D-2000 (polypropylene glycol diamine of an average molecular weight of 2,000, manufactured by Texaco Chemical Co.), and then 20 g of aqueous 50% caustic soda solution was added thereto. While being ice-cooled, 20 g of acryloyl chloride was added dropwise over a period of 60 minutes, and then the resulting mixture was stirred for 30 minutes at room temperature.

Thereafter, 300 ml of water was added, and the organic layer was separated and washed three times with 300 ml of saturated aqueous sodium chloride solution. Thereafter, the organic layer was dried with magnesium sulfate and subjected to filtration, and the solvent was evaporated off under reduced pressure to give 163 g of oily product Yield 77%

EXAMPLE 9

Into 50 ml of methylene chloride was dissolved 35.8 g of polytetramethylene ether glycol bisaminopropyl ether, and then 10 g of aqueous 50% caustic soda solution was added thereto While being ice-cooled, 9.5 g of acryloyl chloride was added dropwise over a period of 20 minutes, and then the resulting mixture was stirred for 30 minutes at room temperature.

Thereafter 50 ml of water was added, and the organic layer was separated and washed three times with 50 ml of water. Thereafter, the organic layer was dried with magnesium sulfate and subjected to filtration, and the solvent was evaporated off under reduced pressure to give 29 g of product Yield 71%

EXAMPLE 10

Into 100 ml of methylene chloride was dissolved 101 g of bisaminopropyl ether of NEWPOLE PE-61, (manufactured by Sanyo Chemical Ind., Co.), and then 10 g of aqueous caustic soda solution was added thereto. While being ice-cooled, 9.5 g of acryloyl chloride was added dropwise over a period of 20 minutes, and then the resulting mixture was stirred for 30 minutes at room temperature.

Thereafter, 100 ml of water was added, and the organic layer was separated and washed three times with 50 ml of water. Thereafter, the organic layer was dried with magnesium sulfate and subjected to filtration, and the solvent was evaporated off under reduced pressure to give 80 g of product. Yield: 75%.

EXAMPLE 11

Into 100 ml of methylene chloride was dissolved 20 g of JEFFAMINE T-403 [polypropylene glycol triamine set forth below by the formula (III) and manufactured by Texaco Chemical Co.], and then 150 g of aqueous 10% caustic soda solution was added thereto. While being ice-cooled, 15 g of acryloyl chloride was added dropwise over a period of 60 minutes and then the resulting mixture was stirred for 30 minutes at room temperature.

Thereafter, the organic layer was separated and washed three times with 100 ml of saturated aqueous sodium chloride solution. Thereafter, the organic layer was dried with magnesium sulfate and subjected to filtration, and the solvent was evaporated off under reduced pressure to give 28 g of oily product. Yield: 96%.

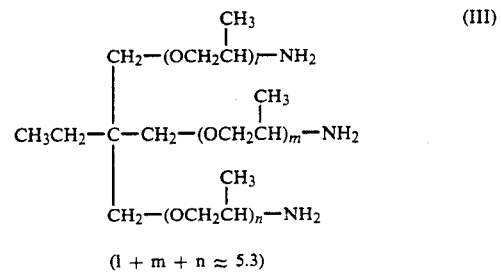

$(l + m + n \approx 5.3)$

EXAMPLES 12~20

Curable resin compositions were prepared by mixing one of the polymerizable monomers synthesized in Examples 2~8 and in Example 11 with DAROCURE 1173 (UV polymerization initiator, manufactured by E. Merck Co.) in the following ratio:
Polymerizable monomer: 97 parts by weight
Initiator: 3 parts by weight.

Each of the resin compositions so prepared was placed in an aluminum can having an inner diameter of 4 cm and a depth of 5 mm and then cured by using a 400 W high pressure mercury lamp, and the length of time required for the curing was measured.

Results obtained are shown in Table 1.

COMPARATIVE EXAMPLE 1~3

The test of Example 12~19 was repeated, using NK ester A-600 (polyethylene glycol #600 diacrylate, manufactured by Shinnakamura Chemical Co.), NK ester APG-400 (polypropylene glycol #400 diacrylate, manufactured by Shinnakamura Chemical Co.) and N-vinylpyrrolidone (N-VP) as a polymerizable monomer.

Results obtained are also shown in Table 1.

TABLE 1

| | Monomer | Partially curing time* (s) | Full curing time** (s) |
|---|---|---|---|
| Example 12 | Example 1 | 1 | 5 |
| Example 13 | Example 2 | 1 | 3 |
| Example 14 | Example 3 | 1 | 1 |
| Example 15 | Example 4 | 1 | 1 |
| Example 16 | Example 5 | 1 | 5 |
| Example 17 | Example 6 | 1 | 15 |
| Example 18 | Example 7 | 1 | 15 |
| Example 19 | Example 8 | 1 | 30 |
| Example 20 | Example 11 | 3 | 5 |
| Comparative Example 1 | A-600 | 1 | 30 |
| Comparative Example 2 | APG-400 | 30 | 60 |
| Comparative Example 3 | N-VP | 30 | 60 |

*Irradiation time until the mass has been cured inside but remains tacky on the surface.
**Irradiation time until the mass has been fully cured not only inside but also outside.

EXAMPLES 21~23

Curable resin compositions were prepared by mixing each of the polymerizable monomers synthesized in Examples 4, 5 and 7 with DAROCURE 1173 (manufactured by E. Merck Co.) in the following ratio:
Polymerizable monomer: 99 parts by weight
Initiator: 4 parts by weight.
The resin compositions were deaerated under reduced pressure and then sandwiched between two glass plates (thickness: 2 mm), using a spacer of 0.4 mm. The resins were then exposed through one of the glass plates to a 400 W high pressure mercury lamp for a period of 30 seconds. After the glass plates were taken off, the resins were exposed to the same mercury lamp for additional 30 seconds to form films having a thickness of 300 to 400 μm.

The thus formed films were cut into strips having a length of 8 cm and a width of 5 mm. The strips were subjected to tensile test to determine maximum stress and elongation at break, and the toughness factor (Tf) of the strips were calculated therefrom [Tf=maximum strength × elongation at break].

COMPARATIVE EXAMPLES 4~5

The test of Examples 21 to 23 was repeated, using NK Ester A-600 and NK Ester APG-400 as a polymerizable monomer.

Results obtained are also shown in Table 2.

TABLE 2

| | Monomer | Tensile Strength (kgf/cm$^2$) | Maximum Elongation (%) | Tf |
|---|---|---|---|---|
| Example 21 | Example 4 | 14 | 6 | 84 |
| Example 22 | Example 5 | 19 | 10 | 190 |
| Example 23 | Example 7 | 70 | 8 | 560 |
| Comparative Example 4 | A-600 | 12 | 5 | 60 |
| Comparative Example 5 | APG-400 | 15 | 5 | 75 |

EXAMPLE 24

A photo-sensitive resin composition was prepared by mixing 40 parts by weight of JEFFAMINE T-403-trisacrylamide synthesized in Example 11, 50 parts by weight of Epoxy Acrylate 80 MFA (manufactured by Kyoeisha Chemical Co. Ltd.), 10 parts by weight of N-vinylpyrrolidone and 1 part by weight of benzoin isopropyl ether, and then by heating the mixture until the formation of a uniform solution.

The composition was cast on a glass plate and exposed to a 400 W high pressure mercury lamp for a period of 1, 2 or 5 minutes, and the curing rate of the cast film and the state of the film so cured were determined.

Results obtained are shown in Table 3.

COMPARATIVE EXAMPLE 6

The procedure of Example 23 was repeated, except that trimethylolpropane triacrylate was used instead of JEFFAMINE T-403-trisacrylamide.

Results obtained ar also shown in Table 3.

TABLE 3

| | Curing time | | |
|---|---|---|---|
| | 1 min | 2 min | 5 min |
| Example 24 | ○ | ○ | ○ |
| Comparative Example 6 | × | △ | Crack |

○ — Cured
△ — Partially cured
× — Not cured

EXAMPLE 25

A photosensitive resin composition was prepared by dissolving 40 parts by weight of alcohol-soluble nylon (AQ-Nylon A-70 available from Toray) in 60 parts of ethanol/water (4:1) by heating and mixing, followed by adding a solution of 35 parts by weight of the polymerizable monomer obtained in Example 9, 1.2 parts by weight of 2,2-dimethoxy-2-phenylacetophenone and 0.08 parts by weight of p-methoxyphenol.

The composition thus obtained was poured onto a steel substrate with an anti-halation layer, and dried in the dark at 80° C. for 2 hours to obtain a photosensitive resin plate having a ca. 1 mm photosensitive resin layer.

A negative film having isolated dots of 170, 200, 250, 320, and 660 microns in diameter was contacted with the surface of the above obtained resin plate, and exposed with a 65 W chemical lamp at a distance of 5 cm for 1 minute and 20 seconds. Then, the unexposed resin portion was eliminated by brushing with alcohol at 40° C. for 2 minutes, and the thus treated plate was dried at 90° C. for 30 minutes and further exposed to the light of the above chemical lamp for 5 minutes.

The resulted plate held 170 microns isolated dot, and the depth of 3.5 mm hole was ca. 1 mm. Hardness of the plate was 67° by means of Shore D hardness meter, and the plate did not crack even by bending for 180°, exhibiting excellent toughness and hardness. The processed plate did not show any cracking tendency by bending even after being stored for 6 months.

EXAMPLE 26

A photosensitive resin composition was prepared by dissolving 40 parts by weight of partially saponified polyvinyl acetate (polymerization degree: 500, hydrolysis value: 80 mol %, GOHSENOL KL-05 available from Nippon Gohsei Kagaku) in 60 parts by weight of water by heating and mixing, followed by adding a solution of 35 parts by weight of the polymerizable monomer obtained in Example 4, 1.2 parts by weight of 2,2-dimethoxy-2-phenylacetophenone and 0.08 parts by weight of p-methoxyphenol.

The composition thus obtained was poured onto a steel substrate with an anti-halation layer, and dried at 80° C. for 2 hours to obtain a photosensitive resin plate having a ca. 1 mm photosensitive resin layer.

A negative film having isolated dots of 170, 200, 250, 320 and 660 microns in diameter was contacted with the surface of the above obtained resin plate, and exposed with a 65 W chemical lamp at a distance of 5 cm for 1 minute and 20 seconds. Then, the unexposed resin portion was eliminated by brushing with water at 40° C. for 1 minute and 50 seconds, and the thus treated plate was dried at 90° C. for 30 minutes and further exposed to the light of the above chemical lamp for 5 minutes.

The resulted plate held 170 microns isolated dot, and the depth of 3.5 mm hole was ca. 1 mm. Hardness of the plate was 75° by means of Shore D hardness meter, and the plate did not crack even by bending for 180°, exhibiting excellent toughness and hardness. The processed plate did not show any cracking tendency by bending even after being stored for 6 months.

COMPARATIVE EXAMPLE 7

A photosensitive resin plate was obtained as generally described in Example 26, with the exception that 15 parts by weight of ethyleneglycol dimethacrylate and 15 parts by weight of N-vinyl-2-pyrrolidone (available from Wako Pure Chemical) were used instead of the polymerizable monomer obtained in Example 4.

The resulted plate held only 600 microns isolated dot, and the dot structure seemed side-etched. Hardness was 85° Shore D, but the plate was cracked by bending for 90°.

EXAMPLE 27

A photosensitive resin composition was prepared by dissolving 40 parts by weight of partially saponified polyvinyl acetate (polymerization degree: 500, hydrolysis value: 88 mol %, GOHSENOL GL-05 available from Nippon Gohsei Kagaku) in 60 parts by weight of water by heating and mixing, followed by adding a solution of 30 parts by weight of the polymerizable monomer obtained in Example 3, 5 parts by weight of the polymerizable monomer obtained in Example 11, 1.2 parts by weight of 2,2-dimethoxy-2-phenylacetophenone and 0.08 parts of p-methoxyphenol.

A sample was taken at the position of 1 cm above the resin (ca. 60° C.) by using a detective tube of formalin gas, and no formalin was detected.

The composition thus obtained was poured onto a steel substrate with an anti-halation layer, and dried at 80° C. for 2 hours to obtain a photosensitive resin plate having a ca. 1 mm photosensitive resin layer.

A negative film having isolated dots of 170, 200, 250, 320 and 660 microns in diameter was contacted with the surface of the above obtained resin plate, and exposed with a 65 W chemical lamp at a distance of 5 cm for 1 minute and 20 seconds. Then, the unexposed resin portion was eliminated by brushing with water at 40° C. for 1 minute and 50 seconds, and the thus treated plate was dried at 90° C. for 30 minutes and further exposed to the light of the above chemical lamp for 5 minutes.

The resulted plate held 200 microns isolated dot, and the depth of 3.5 mm hole was 0.8 mm. Hardness of the plate was 78° by means of Shore D hardness meter, and the plate did not crack even by bending for 180°, exhibiting excellent toughness and hardness. The processed plate did not show any cracking tendency by bending even after being stored for 8 months.

COMPARATIVE EXAMPLE 8

A photosensitive resin plate was obtained as generally described in Example 27, with the exception that 35 parts by weight of bisether compound obtained by condensation reaction of N-methylolacrylamide and triethylene glycol were used instead of the polymerizable monomer obtained in Example 3 and 11.

A sample was taken at the position of 1 cm above the resin (ca. 60° C.) by using a detective tube of formalin gas, and approximately 0.2 ppm of formalin was detected.

EXAMPLE 28

A photosensitive resin composition was prepared by dissolving 40 parts by weight of partially saponified polyvinyl acetate (polymerization degree: 500, hydrolysis value: 80 mol %, GOHSENOL KL-05 available from Nippon Gohsei Kagaku) in 60 weight parts of water by heating and mixing, followed by adding a solution of 35 parts by weight of the polymerizable monomer obtained in Example 4, 5 parts by weight of the polymerizable monomer obtained in Example 1, 1.3 parts by weight of 2,2-dimethoxy-2-phenylacetophenone and 0.08 weight parts of p-methoxyphenol.

The composition thus obtained was poured onto a steel substrate with an anti-halation layer, and dried at 80° C. for 2 hours to obtain a photosensitive resin plate having a ca. 1 mm photosensitive resin layer.

A negative film having the isolated dots of 170, 200, 250, 320 and 660 microns in diameter was contacted with the surface of the above obtained resin plate, and exposed with a 65 W chemical lamp at a distance of 5 cm for 1 minute and 20 seconds. Then, the unexposed resin portion was eliminated by brushing with water at 40° C. for 1 minute and 50 seconds, and the thus treated plate was dried at 90° C. for 30 minutes and further exposed to the light of the above chemical lamp for 5 minutes.

The resulted plate held 170 microns isolated dot, and depth of 3.5 mm hole was 1 mm. Hardness of the plate was 65° by means of Shore D hardness meter, and the plate did not crack even by bending for 180°, exhibiting excellent toughness and hardness. The processed plate did not show any cracking tendency by bending even after being stored for 6 months.

EXAMPLE 29

After dissolving 100 parts by weight of a methyl methacrylate/methacrylic acid copolymer (trade name: BR-77, manufactured by Mitsubishi Rayon Co., weight average molecular weight of about 70,000) into 1000 parts by weight of methyl ethyl ketone, 75 parts by weight of pentaerythritol triacrylate and 25 parts by weight of the polymerizable monomer prepared in Example 2 were added to obtain a first solution.

Then, 5 parts by weight of 22-dimethoxy-2-phenyl acetophenone and 0.1 part by weight of p-methoxyphenol were dissolved into 300 parts of methyl cellosolve to prepare a second solution, and the entire amount of the solution was added to the first solution and stirred sufficiently to obtain photosensitive solution.

Then, the photosensitive solution was coated onto an aluminum substrate by using a bar coater in order to obtain the dry-coating weight of 2 g/m$^2$ after dried in a drier at 60° C. for 30 min. A photosensitive layer of 2.0 μm thickness was obtained. A 5% aqueous solution of polyvinyl alcohol (hydrolysis value: 88 mol %, polymerization degree: 500) was coated on the photosensitive layer to thickness of 2.0 μm by using a bar coater to prepare an overcoat layer.

The printing material was brought into contact with a negative film in vacuum and exposed to a 3 kW high pressure mercury lamp at a distance of 80 cm for 1 minute and 30 seconds.

It was developed by using a developer (10 parts by weight of anhydrous sodium carbonate, 50 parts by weight of butyl cellosolve and 3 parts by weight of an anionic surface active agent dissolved into 1000 parts of water) and dried at 80° C. for 1 minute to prepare an offset printing material. Halftone reproductivity was 2%~98% at 85 lpi.

When printing was applied by using a small-sized offset printing machine, satisfactory printed matters were obtained.

EXAMPLE 30

After charging 100 parts by weight of crystalline 1,2-polybutadiene (trade name, "JSR RB 810", manufactured by Japan Synthetic Rubber Co., crystallinity: 15%) and 100 parts by weight of a polyisoprene rubber (trade name, "JSR IR 2200" manufactured by Japan Synthetic Rubber Co.) into a pressurizing kneader and mixing at a temperature of 100° C. for 80 minutes, a solution previously prepared by dissolving 3 parts by weight of benzoin isopropyl ether and 0.05 parts by weight of p-methoxyphenol into 20 parts by weight of neopentyl glycol dimethacrylate and 5 parts by weight of the polymerizable monomer prepared in Example 11 were further added and mixed for 5 minutes. The uniformly mixed composition was molded into a sheet-like configuration by using a pressing machine. In the molding, sand blasted polyester sheets were placed above and below the composition respectively and 2 mm spacers were used. They were pressed under the conditions at a temperature of 140° C. and a pressure of 10 kg/cm² for about 50 seconds and then cooled to obtain a sheet of 2 mm thickness. The polyester sheet was detached from one side of the thus obtained sheet, and a negative film was contacted to the surface of the resin sheet in vacuum and the resin sheet was exposed to a high pressure mercury lamp for 5 minutes at a distance of 80 cm. After the completion of the exposure, the nagative film was removed and xylene was sprayed at a pressure of 2 kg/cm² to the surface of the printing material for 4 minutes to obtain a relief thickness of about 700 μm. Then, it was dried by a drier and the entire surface of the printing material was again exposed to the high pressure mercury lamp for 3 minutes, to obtain a relief printing material. The thus obtained printing material comprised an image exactly reproducing that of the original and had a hardness (Shore A hardness meter) of 55°, with a sufficient rubber elasticity for a flexographic printing.

EXAMPLE 31

A photosensitive resin composition was prepared by dissolving 40 parts by weight of partially saponified polyvinyl acetate modified with itaconic acid (polymerization degree: 330, hydrolysis value: 73.2 mol %) in 6 parts by weight of water by kneading at 80 to 85° C. for 30 minutes, followed by adding a solution of 30 parts by weight of the polymerizable monomer obtained in Example 4, 0.5 parts by weight of 2,2-dimethoxy-2-phenylacetophenone and 0.05 parts by weight of p-methoxyphenol, and by further kneading them at 80° C. for 30 minutes.

The composition thus obtained was extruded by means of twin-screw extruder at 80° C. onto the steel substrate of 0.3 mm thickness with an anti-halation layer. A photosensitive resin sheet of 1.0 mm thickness was formed on the substrate, and was laminated with cover film.

A negative film having the isolated dots of 170, 200, 250, 320 and 660 microns diameter was contacted to the surface of the above obtained resin plate, and exposed to a 65 W chemical lamp at a distance of 5 cm for 1 minute and 20 seconds. Then, the unexposed resin portion was eliminated by brushing with water at 40° C. for 1 minute and 50 seconds, and the thus treated plate was dried at 90° C. for 30 minutes and further exposed to the light of the above chemical lamp for 5 minutes.

The resulted plate held 200 microns isolated dot, and depth of 3.5 mm hole was 1 mm. Hardness of the plate was 73° by means of Shore D hardness meter, and the plate did not crack even by bending for 180°, exhibiting excellent toughness and hardness. The processed plate did not show any cracking tendency by bending even after being stored for 6 months.

EXAMPLE 3

A photosensitive resin plate was obtained as generally described in Example 31, with the exception that 20 parts by weight of the polymerizable monomer obtained in Example 4, and 10 parts by weight of ethyleneglycol dimethacrylate (NK ester 2G available from Shin-Nakamura Kagaku Co.,) were used instead of the polymerizable monomer obtained in Example 4.

The resulted plate held 250 microns isolated dot. Hardness of the plate was 80° by Shore D, and the plate did not crack even by bending for 90°. Matrix board preparation from this place was tried with phenolic resin powder under 150° C., 50 kg/cm² for 10 minutes. No deformation of relief image was observed, and faithfulness of the image between the original plate and the rubber plate duplicated from the above matrix plate was good.

EXAMPLE 33

To 85 parts by weight of photosensitive acrylic resin (molecular weight: 8800, Tg=20° C.) which was obtained by the reaction of methacrylic acid and prepolymer obtained by solution polymerization of styrene, methyl methacrylate, n-butyl acrylate, glycidyl methacrylate and 2-hydroxyethyl acrylate, 15 parts by weight of a photo-sensitive polyether acrylamide derivative which was prepared in Example 6 and 3 parts by weight of benzoin methyl ether were added.

After the resulted composition was mixed well and defoamed, UV ray curable composition was obtained.

The composition thus obtained was applied on a gulvanized steel substrate to a dry film thickness of 100 μm using a doctor blade. The photo-sensitive plate thus obtained was irradiated on the conveyer at the conveying speed of 20 cm/min. with high pressure mercury lamps (Nippon Storage Battery Co., Ltd., Model HI-20N, 80 W/cm, equipped with a reflector beam collector) which were placed over a conveyer at a height of 80 mm with the orientation of longitudinal axis of the lamp being perpendicular to the moving direction of the conveyer.

The resulted cured film exhibited a pencil hardness of 2 H and the adhesion strength according to the Erichsen of 5 mm showed an excellent result. And when the steel substrate was bended by 6 T-bent, painted film had a good adhesion.

EXAMPLE 34

To 70 parts by weight of polyetherurethane diacrylate resin obtained by modification of polytetramethylene glycol (M.W.=2,000) with tolylene diisocyanate and 2-hydroxyethyl acrylate, 35 parts by weight of a photo-sensitive polyether acrylamide derivative which was prepared in Example 7 and 3 weight parts of benzoin methyl ether were added.

After the resulted composition was mixed well and defoamed, UV ray curable composition was obtained.

The composition thus obtained was applied on a steel substrate to a dry film thickness of 200 μm using a doctor blade and irradiated as generally described in Example 33.

The resulted cured film exhibited a pencil hardness of H. A specimen for tensile testing was made by stripping the film from the steel substrate and was tested under 20° C. The specimen exhibited an excellent strength and toughness of the fill such as initial Young's modulus of 0.4 kg/cm$^2$ and an elongation of 55%.

EXAMPLE 35

To 75 parts by weight of epoxy acrylate resin (M.W.:1000) which was obtained by modification of bisphenol-A type epoxy resin with acrylic acid, 20 parts by weight of a photo-sensitive polyether acrylamide derivative which was prepared in Example 10 and 5 parts by weight of trimethylol propane triacrylate were added.

After the resulted composition was mixed well and defoamed, electronic ray curable composition was obtained.

The composition thus obtained was applied on a polyvinylchloride sheet to a dry film thickness of 200 μm, then, the film was irradiated with electron beam having an electron energy of 300 KeV at an electron current of 30 mA, until a dose of 3M rad was obtained. The resulted cured film was transparent, tackfree, and exhibited a pencil hardness of 2 H.

EXAMPLE 35

To 30 parts by weight of acrylate resin (M.W.=3,500) which was obtained by the modification of polyester resin (acid value: 8, hydroxyl value: 120) obtained from adipic acid, isophthalic acid, trimethylolpropane and neopentyl glycol with acrylic acid, 50 parts by weight of polyester resin (acid value: 55, hydroxyl value: 20), 20 parts by weight of a photo-sensitive polyether acrylamide derivative which was prepared in Example 5 and 3 parts by weight of benzoin methyl ether were added.

After the resulted composition was mixed well and defoamed, UV ray curable composition was obtained.

The composition thus obtained was applied on a high grade art paper to a dry fill thickness of 5 μm and irradiated as generally described in Example 33.

The film thus obtained had enough gloss and good adhesion to the substrate.

EFFECT OF THE INVENTION

The polyether acrylamide derivatives according to the present invention exhibit good solubility in organic solvent or water etc., good compatibility with other polymeric binders, high sensitivity to active energy rays, excellent film characteristics in flexibility and toughness and superiority in safety without generation of harmful gas such as formalin, when it is used as a photo-sensitive composition prepared by using polyether acrylamide derivatives alone or by the combination of it with other polymer binders.

What is claimed is:

1. A polyether acrylamide represented by the following general formula (I):

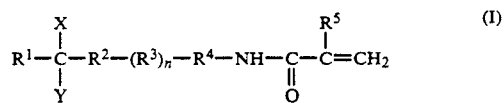

wherein R$^1$ represents —H; R$^2$ represents —CH$_2$—; R$^3$ represents —OCH$_2$CH$_2$—, n is an integer of 1-15; R$^4$ represents —OCH$_2$CH$_2$CH$_2$—; R$^5$ represents H; X represents H; and Y represents Formula II given below:

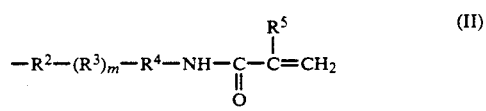

wherein R$^2$ represents a single bond, R$^3$, R$^4$ and R$^5$ have the same meaning as in formula (I), m being an integer of 1 to 15.

2. A polyether bisacrylamide represented by the general formula:

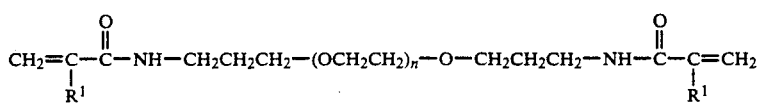

wherein R$^1$ represents —H or —CH$_3$, n being an integer of 9 to 15.

* * * * *